(12) United States Patent
Doorn

(10) Patent No.: US 9,219,412 B2
(45) Date of Patent: Dec. 22, 2015

(54) BUCK CONVERTER WITH REVERSE CURRENT PROTECTION, AND A PHOTOVOLTAIC SYSTEM

(71) Applicant: NXP B.V., Eindhoven (NL)

(72) Inventor: Tobias Sebastiaan Doorn, Shanghai (CN)

(73) Assignee: NXP B.V., Eindhoven (NL)

( * ) Notice: Subject to any disclaimer, the term of this patent is extended or adjusted under 35 U.S.C. 154(b) by 311 days.

(21) Appl. No.: 13/910,715

(22) Filed: Jun. 5, 2013

(65) Prior Publication Data

US 2013/0328537 A1 Dec. 12, 2013

(30) Foreign Application Priority Data

Jun. 7, 2012 (EP) .................................. 12171141

(51) Int. Cl.
G05F 1/56 (2006.01)
H02M 3/156 (2006.01)
H02M 1/32 (2007.01)
H02M 3/158 (2006.01)
H03K 17/0814 (2006.01)
G05F 1/565 (2006.01)

(52) U.S. Cl.
CPC ............... *H02M 3/156* (2013.01); *H02M 1/32* (2013.01); *H02M 3/1588* (2013.01); *H03K 17/08142* (2013.01); *G05F 1/565* (2013.01); *Y02B 70/1466* (2013.01); *Y02E 10/56* (2013.01)

(58) Field of Classification Search
CPC ............. G05F 1/10; G05F 1/46; G05F 1/565; G05F 1/569

USPC .......................................... 323/268, 271, 282
See application file for complete search history.

(56) References Cited

U.S. PATENT DOCUMENTS

| | | | |
|---|---|---|---|
| 4,471,237 A | 9/1984 | Kaplan | |
| 5,764,077 A * | 6/1998 | Andresen et al. | 326/34 |
| 6,154,081 A | 11/2000 | Pakkala et al. | |
| 6,738,242 B1 * | 5/2004 | Kwong et al. | 361/56 |
| 7,339,360 B2 * | 3/2008 | Chen et al. | 323/284 |
| 2004/0196096 A1 | 10/2004 | Kondo et al. | |
| 2008/0106236 A1 | 5/2008 | Tang et al. | |
| 2009/0128111 A1 | 5/2009 | Chien | |
| 2013/0057992 A1 * | 3/2013 | Altolaguirre et al. | 361/56 |
| 2013/0155562 A1 * | 6/2013 | Kubota et al. | 361/91.5 |

FOREIGN PATENT DOCUMENTS

| | | |
|---|---|---|
| JP | 2006-174612 A | 6/2006 |
| JP | 2006-230066 A | 8/2006 |

OTHER PUBLICATIONS

Extended European Search Report for EP Patent Appln. No. 12171141.0 (Jan. 22, 2013).

* cited by examiner

*Primary Examiner* — Matthew Nguyen

(57) ABSTRACT

A buck converter is disclosed comprising a series combination of high-side and low-side switches, and including a protection switch in anti-series with the high-side switch. The protection switch is controlled by means of a shutter switch, which is powered from the output of the converter and gated from the half bridge node of the converter. Also disclosed is a photovoltaic system comprising such a buck converter and a solar panel.

15 Claims, 2 Drawing Sheets

BUCK CONVERTER WITH REVERSE CURRENT PROTECTION, AND A PHOTOVOLTAIC SYSTEM

CROSS-REFERENCE TO RELATED APPLICATIONS

This application claims the priority under 35 U.S.C. §119 of European patent application no. 12171141.0, filed on Jun. 7, 2012, the contents of which are incorporated by reference herein.

FIELD OF THE INVENTION

This invention relates to buck converters.

BACKGROUND OF THE INVENTION

Buck converters are generally used to transform a relatively higher DC voltage into a relatively lower DC voltage. An example of a buck converter is shown in FIG. 1. The converter comprises a high-side switch Mp 1 and a low-side switch Mn 2 connected in series between a supply 30 and a ground 4. The control terminal 11 of the high-side switch 1 is controlled by means of a switch controller 14, and the control terminal 21 of the low side switch to is controlled by switch controller 24. The switches are closed in alternation such that the half-bridge node 5 therebetween is alternately connected to supply 30 and to ground 4. An output filter consisting of an inductor L and capacitor C filter the switching signals to create a DC voltage at the output 35; the DC output voltage may be used to drive a load Rload as shown.

In the case that a negative voltage with respect to ground is applied to the input of a buck converter and the input voltage is sufficiently negative to forward bias the body diodes of the switches 1 and 2, a negative current can be the result, as shown at 101. If switches 1 and 2 are low-ohmic, which is typically the case for high efficiency converters, the resulting current may be high and lead to damage to the converter. Such a situation could occur in a range of applications, such as, for instance and without limitation, for converting the output voltage of photovoltaic cells, strings or panels, or other applications in which a variable voltage source is associated with a storage device, or other load, having a relatively fixed or invariant input voltage.

Similarly, such a situation could occur where a power source with a relatively fixed or invariant output voltage is associated with a storage device, such as a lithium ion based battery, having a more variable input voltage.

Further, in situations in which the output is charged via a path (shown as $V_{aux}$ in FIG. 1) other than the input, current can flow into the input, as shown at 102.

In order to overcome these problems, it is known to add a diode 6 in anti-series with the power switches, thus preventing reverse currents to the input either from the power stage or the output as shown in FIG. 2. The series diode however has a significant voltage drop in normal operation, when it is forward biased. This results in power being dissipated in the diode which can have a significant impact on the efficiency of the buck converter, especially when low-ohmic power switches are used.

Japanese Patent application Publication J2006-174612 discloses a buck converter in which, in place of the diode 6, a transistor is connected in anti-series with the high-side switch to prevent reverse currents. The transistor is controlled by the control block which also controls the timing of the switching of the high-side and low-side switches. By replacing the diode with a transistor, the efficiency losses associated with the forward bias drop in the diode may be to a large extent avoided.

SUMMARY OF THE INVENTION

According to embodiments there is provided a buck converter having an input and an output and comprising: a high-side switch, a low-side switch, a protection switch and a shutter switch, each having a respective control terminal and respective first and second main terminals; the first low-side main terminal being connected to a ground, the second low-side main terminal and the first high-side main terminal being connected to a converter node which may generally be a half-bridge node, the second high-side main terminal being connected to the second protection main terminal and the first protection main terminal being connected to an input node such that the high-side switch and the protection switch are in anti-series, the first shutter main terminal being connected to the protection control terminal, the shutter control terminal being electrically coupled to the input node, and the second main shutter terminal being connected to the output. That is to say, the high-side switch has a high-side control terminal and first and second high-side main terminals; the low-side switch has a low-side control terminal and first and second low-side main terminals; the protection switch has a protection control terminal and first and second protection main terminals; and the shutter switch has a shutter control terminal and first and second shutter main terminals.

The anti-series configuration of the high-side switch and the protection switch operates to prevent reverse currents through the high-side switch and low-side switch. The use of a shutter switch to control the protection switch is particularly convenient and inexpensive. Further, and in contrast to use of a control block to control both the protection switch in and the high-side and low-side switches, according to embodiments, even if the converter is not operational and any battery that is connected to the output is discharged, there may be control of the output voltage and it may be that proper operation of the protection switch can be guaranteed. The shutter switch according to embodiments may be capable of controlling the protection switch to prevent reverse currents from both ground and the output, even when the buck converter is inactive, because it makes the protection switch work for Vout>=Vin. Yet further, it may be possible to use a low-voltage transistor for the protection switch, without the requirement for any level shifters.

In embodiments, the buck converter further comprises a resistive component between the protection switch control terminal and the second protection main terminal. The resistive component may act as a gate-source resistor to ensure the gate of the protection switch does not float.

In embodiments, one or more of the high-side switch, low-side switch, protection switch and shutter switch comprises an MOS transistor.

In embodiments, the shutter control terminal is electrically coupled to the input node by means of a floating supply for providing an offset voltage (Vfloat) from a voltage at the input node, and wherein the protection switch is a PMOS transistor. This floating supply may be considered a secondary floating supply, in case the high-side switch is driven from a further, or primary, floating supply. In other embodiments, the shutter control terminal may be electrically directly coupled to the input node, and the high-side switch is a NMOS transistor. An NMOS transistor generally is smaller, for the same on-resistance, than the comparable PMOS transistor. However, NMOS transistors may require a boot-strap circuit.

In embodiments there further comprises a bootstrap supply arrangement arranged for supplying the protection control terminal.

The bootstrap supply arrangement may comprise a bootstrap capacitor and a rectifier. The protection control terminal may be electrically coupled to the first shutter main terminal by an inverter. An inverter may be necessary for an NMOS or an NDMOS protection transistor. The inventor may comprise first and second inverter transistors.

In embodiments a voltage rating of the protection switch is less than half the voltage rating of at least one of the high-side switch and the low-side switch.

According to another aspect there is provided a photovoltaic system comprising a solar panel having an electrical output, and a power converter comprising a buck converter as described above wherein the input is electrically coupled to the solar panel electrical output. The buck converter may be connected to a battery, or other storage device such as a capacitor.

The solar panel may provide a higher voltage than the input voltage of the battery or other storage device.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

Figure 1:
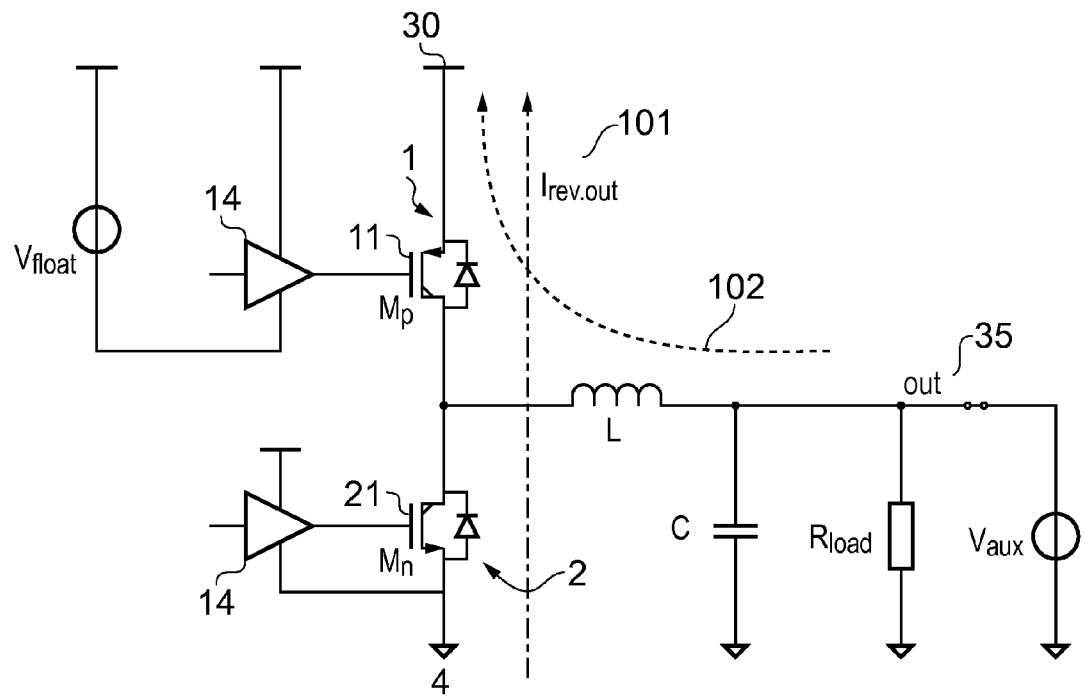
FIG. 1 illustrates a buck converter.
Figure 2:
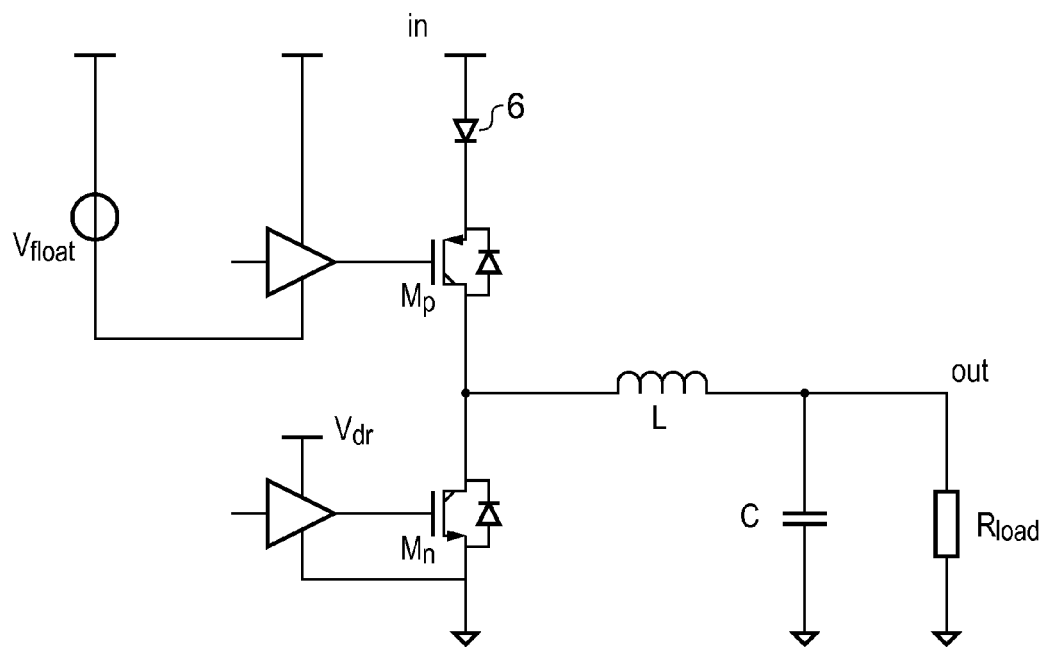
FIG. 2 illustrates a buck converter which is generally similar to that shown in FIG. 1 but includes a protection diode.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

Figure 3:
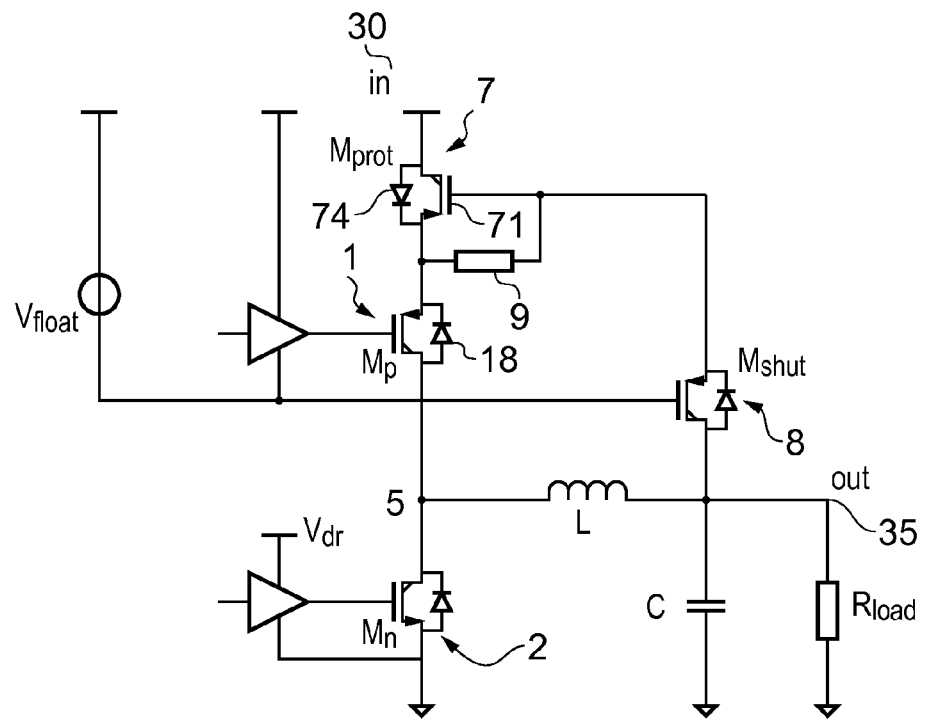
FIG. 3 illustrates a buck converter having a protection switch controlled by a shutter switch.

An example of a buck converter, for converting an input voltage $V_{in}$ to an output voltage $V_{out}$, according to embodiments, is shown in FIG. 3. The buck converter shown in FIG. 3 includes a protection switch 7, which is connected in anti-series with the high-side switch 1 and between the high-side switch and the supply 30. By 'anti-series' is meant that the body diode 74 of the protection switch 7 is arranged with the opposite polarity to the polarity of the body diode 18 of the high-side switch 1. The protection switch may be dimensioned so as to have a low on-resistance in order to reduce its conduction losses. Further, the dimensions of the protection switch may be relatively small, since a low-voltage switch can be used and as the skilled person will appreciate, in general, the size of switch scales approximately quadratically with its voltage rating. (As shown in FIG. 3, the protection switch need not be a high voltage switch, whereas the high-side and low-side switches of the buck converter are both high voltage switches.)

The protection switch 7 is controlled by means of a shutter switch 8. As shown in FIG. 3, the shutter switch 8 provides a control voltage to control terminal 71 of protection switch 7, while preventing excessive voltage stress on the gate-source terminals of protection switch 7. The gate of shutter 8 is connected to a floating supply (Vfloat), thereby preventing the gate-source voltage of protection switch 7 to exceed Vfloat. Vfloat is the floating supply that is required to correctly drive the PDMOS power FET 1, and supplies a voltage derived from the input voltage Vin The shutter switch determines the correct conditions to enable (that is to say, close) the protection switch—that is, when $V_{in}>V_{out}+V_t$. The additional voltage $V_t$ is required in practice, since the shutter switch has a threshold voltage $V_t$, so the switch is only enabled if the input voltage exceeds the output voltage by at least the threshold voltage of the protection switch: i.e. if $V_{in}>V_{out}+V_t$. Likewise, the shutter switch disables (that is to say, opens) the protection switch when $V_{in}+V_t<V_{out}$. The protection switch is thereby enabled quickly, to ensure that its gate-source voltage or drain-source voltage does not exceed its limits. Likewise, the shutter switch disables (that is to say, opens) the protection switch when $V_{in}+V_t<V_{out}$.

Although generally not necessary, a gate-source resister 9 may be provided between the gate and source of the protection switch, in order to prevent the gate floating and to ensure that the default state of the switch is off (that is to say open). This is useful in the range where $V_{out}-V_t<V_{in}<V_{out}+V_t$.

Not only should the high-side and low-side switches be high-voltage switches in order to cope with the entire voltage swing between $V_{in}$ and ground, but the shutter switch should similarly be a high-voltage switch, as its drain is connected to the output node 35. However, the shutter switch does not need to be a power switch, since it is used only for control purposes. That is to say, it does not require to have a low on-resistance Rdson. Moreover, the protection switch, although it must have sufficient current-carrying capacity to handle the input current, does not need to be a high-voltage switch. The skilled person will appreciate that the protection against an output voltage which is higher than the input will in general be limited to the voltage rating $Vprot_{max}$ of the protection switch using a low voltage switch for the protection switch, that is to say: $(V_{out}-V_{in})_{max}-Vprot_{max}>=0$.

Figure 4:
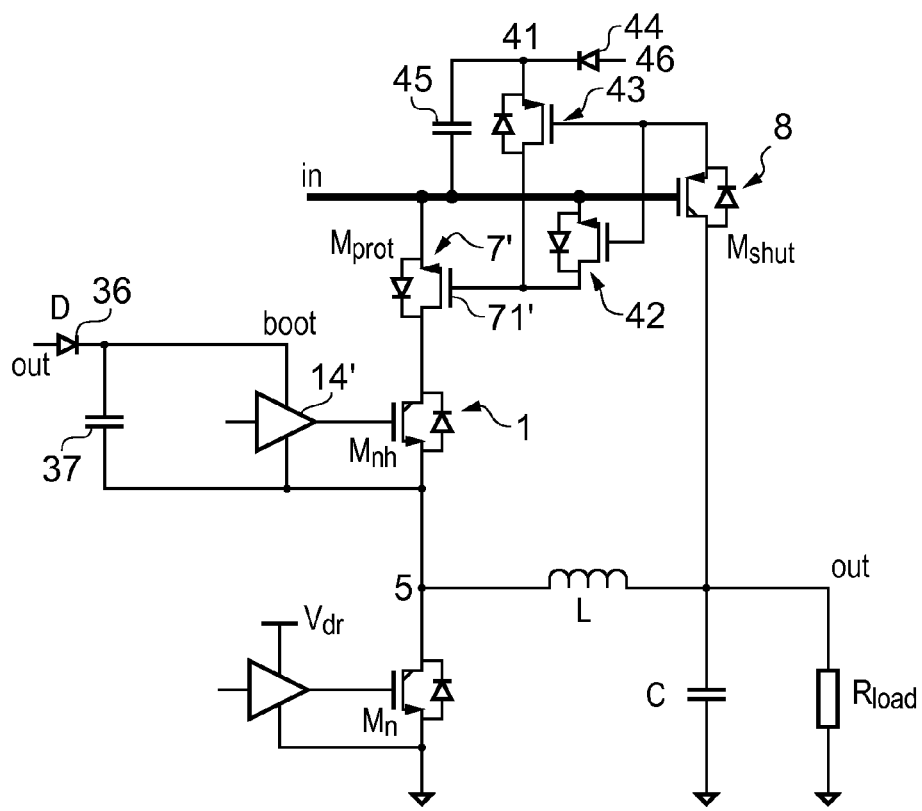
FIG. 4 illustrates a buck converter having a protection switch controlled by a shutter switch and being supplied by a bootstrap supply.

As shown in FIG. 3, the protection switch 7 may be a P-type transistor. FIG. 4 shows the further embodiment of the invention in which the protection switch comprises an N-type transistor 7'. As will be immediately apparent to the skilled person, use of an N-type transistor as the switch generally requires a bootstrap supply in order to enable it. This bootstrap supply may also be called as a secondary bootstrap supply, since it is supplied from another bootstrap supply. This other bootstrap supply is the primary bootstrap supply which is used as a supply to drive the high-side N-type-power FET.

One example configuration of such a circuit is shown in FIG. 4, which comprises a secondary bootstrap supply at node 41, created by secondary bootstrap capacitor 45 from the input (in) and a diode, or other active or passive rectifier 44, from the node 'boot'. That is, to say, there is a physical link—not shown—between the boot node and node 46, such that the primary bootstrap supply 'boot' of the power FET driver is connected, via the diode 44, to the secondary bootstrap supply 41 that is used to provide the control voltage for the NDMOS protection switch 7'. It will be appreciated that in other embodiments, other sources, such as without limitation a charge pump, may be used as a power supply for the secondary bootstrap supply. The node 46 may be connected to any other supply having a sufficiently high voltage.

In the case of the PDMOS protection switch shown in FIG. 3, the source terminal of shutter 8 provides the correct control signal for the protection switch. However, in the embodiment shown in FIG. 4 in which an NDMOS protection switch is used, the control signal has to be inverted, which is done by an inverter, which may be implemented as transistors 42 and 43 as shown: in this implementation, the source of the first transistor 42 is connected to both the input (in) and the gate (control terminal) of the shutter switcher 8; the source of the second transistor is connected to the second bootstrap supply 41; the gates of both transistors 42 and 43 are connected to the source of the shutter switch. The control terminal 71' of the N-type protection switch is connected to the drain of both first and second transistors 42 and 43. Embodiments are not limited to the specific bootstrap circuit shown; other bootstrap circuits, such as are known to the skilled person, may be used.

Since use of an N-type transistor for the protection switch generally requires a bootstrap circuit, this is particularly appropriate in, although not limited to, embodiments in which a bootstrap circuit is already available. This is usually the case when an N-type transistor is used for the high-side switch. FIG. 4 shows an N-type transistor as the high-side switch 1'. The gate controller 14' for the high-side switch is powered from the output by means of the primary boot-strap circuit comprising diode 36 and capacitor 37. The skilled person will appreciate that, for the same on-resistance, N-type transistors, and in particular NDMOS, generally are smaller than the corresponding P-type transistors. There may therefore be a trade-off between the size and thus cost of the transistors against the additional complexity of including a bootstrap circuit.

Although not limited thereto, embodiments are particularly useful for buck converters comprising integrated power switches, since such integrated switches may be particularly susceptible to damage by reverse currents.

It will be appreciated that, although as shown in the figures, the N-type and P-type transistor is may be respectively NMOS and PMOS, the invention is not limited thereto, and bipolar transistors, respectively NPN and PNP, may be used for one or more of the switches in place of respective NMOS and PMOS transistors. It will be appreciated that bipolar devices are unidirectional by nature and can therefore be used as blocking devices, although a significant base current is generally required to operate the bipolar switches, in particular when a bootstrap supply is used. The supply will be loaded by the base currents, leading to increased requirements for the bootstrap supply. So, in general, bipolar switches may be used to replace the protection switches and their control, provided that the fabrication technology is sufficient to allow it. Thus, references herein to 'source', 'drain', or 'gate' may be encompass the bipolar equivalents 'emitter', 'collector' (or vice versa) and 'base'. Furthermore, in the case that one or more of NMOS and PMOS transistors are used, they may be 'drift' transistors, that is to say NDMOS or PDMOS respectively. The skilled person will appreciate that use of bipolar transistors in place of FETs generally FETs would not generally extend to replacing the power FETs 1 and 2 by bipolar devices: in case that bipolar transistors are used in place of the power FETs 1 and 2, reverse current protection would not generally be required, since the bipolar transistors are unidirectional by nature. However, when MOS power FETs are used, reverse currents are possible and the reverse current protection may be implemented both with a MOS transistor or a bipolar transistor.

Buck converters according to embodiments of the invention may be used in a wide range of applications. Without limitation, they are particularly suited to applications such as photovoltaics which involve high current levels and/or possible sources of auxiliary charge at the output which could provide a reverse bias between the output and input. A non-limiting example of such an application is a converter added to an individual photovoltaic module in order to improve that module's output power. In some regulatory environments such power converters may have to endure a test in which a negative current is drawn from the input of the converter. To pass the test, preferably no damage should be caused to the power converter; it is particularly important that no catastrophic failure or fire should result from such a test. Furthermore, when the photovoltaic module is not producing power, such that the auxiliary voltage supply at the output exceeds the input voltage, it should be avoided that the charge due to $V_{aux}$ leaks away through the input.

From reading the present disclosure, other variations and modifications will be apparent to the skilled person. Such variations and modifications may involve equivalent and other features which are already known in the art of buck converters, and which may be used instead of, or in addition to, features already described herein.

As used herein, the term 'connected' used with reference to two components or nodes includes direct connection by means of one or more wires, leads or other resistive element. It further may extend to indirect connection, in which the two components or nodes are in communication through a further component, such as a switch or other inductive component.

In summary but without limitation, herein a buck converter is disclosed comprising a series combination of high-side and low-side switches, and including a protection switch in anti-series with the high-side switch. The protection switch is controlled by means of a shutter switch, which is powered from the output of the converter and gated from the half bridge node of the converter.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A buck converter having an input and an output and comprising:
    a high-side switch, a low-side switch, a protection switch and a shutter switch, each having a respective control terminal and respective first and second main terminals;
    the first low-side main terminal being connected to a ground, the second low-side main terminal and the first high-side main terminal being connected to a converter node, the second high-side main terminal being connected to the second protection main terminal and the first protection main terminal being connected to an input node such that the high-side switch and the protection switch are in anti-series, the first shutter main terminal being connected to the protection control terminal, the shutter control terminal being electrically coupled to the input node, and the second main shutter terminal being directly connected to the output;

wherein either;

(a) the protection switch is a NMOS transistor and the shutter control terminal is electrically directly coupled to the input node; or (b) the protection switch is a PMOS transistor and the shutter control terminal is electrically coupled to the input node by a floating supply for providing an offset voltage from a voltage at the input node.

2. A buck converter as claimed in claim 1, wherein at least one of the high-side switch, low-side switch, and shutter switch comprises a MOS transistor.

3. A buck converter as claimed in claim 1, further comprising a resistive component between the protection control terminal and the second protection main terminal.

4. A buck converter as claimed in claim 1 further comprising a bootstrap supply arrangement arranged for supplying the protection control terminal.

5. A buck converter as claimed in claim 4, wherein the bootstrap supply arrangement comprises a bootstrap capacitor and a rectifier.

6. A buck converter as claimed in claim 5, in which the protection switch is a NMOS transistor and the shutter control terminal is electrically directly coupled to the input node wherein the protection control terminal is electrically coupled to the first shutter main terminal by an inverter.

7. A buck converter as claimed in claim 6, wherein the inventor comprises first and second inverter transistors.

8. A buck converter as claimed in claim 1, wherein a voltage rating of the protection switch is less than half the voltage rating of at least one of the high-side switch and the low-side switch.

9. A photovoltaic system comprising a solar panel having an electrical output, and a power converter comprising a buck converter as claimed in claim 1, wherein the input is electrically coupled to the solar panel electrical output.

10. A photovoltaic system as claimed in claim 9, further comprising a storage device electrically coupled to an output of the buck converter.

11. A buck converter having an input and an output and comprising:

a high-side switch, a low-side switch, a protection switch and a shutter switch, each having a respective control terminal and respective first and second main terminals;

the first low-side main terminal being connected to a ground, the second low-side main terminal and the first high-side main terminal being connected to a converter node, the second high-side main terminal being connected to the second protection main terminal and the first protection main terminal being connected to an input node such that the high-side switch and the protection switch are in anti-series, the first shutter main terminal being indirectly connected to the protection control terminal, the shutter control terminal being electrically coupled to the input node, and the second main shutter terminal being directly connected to the output;

wherein the protection switch is a NMOS transistor and the shutter control terminal is electrically directly coupled to the input node;

further comprising a bootstrap supply arrangement arranged for supplying the protection control terminal;

wherein the bootstrap supply arrangement comprises a bootstrap capacitor and a rectifier;

wherein the protection control terminal is electrically coupled to the first shutter main terminal by an inverter;

wherein the inventor comprises first and second inverter transistors; and wherein the first shutter main terminal is connected to the protection control terminal via the first and second transistors of the inverter.

12. A buck converter as claimed in claim 11, wherein at least one of the high-side switch, low-side switch, and shutter switch comprises a MOS transistor.

13. A buck converter having an input and an output and comprising:

a high-side switch, a low-side switch, a protection switch and a shutter switch, each having a respective control terminal and respective first and second main terminals;

the first low-side main terminal being connected to a ground, the second low-side main terminal and the first high-side main terminal being connected to a converter node, the second high-side main terminal being connected to the second protection main terminal and the first protection main terminal being connected to an input node such that the high-side switch and the protection switch are in anti-series, the first shutter main terminal being directly connected to the protection control terminal, the shutter control terminal being electrically coupled to the input node, the second main shutter terminal being directly connected to the output; and wherein the protection switch is a PMOS transistor and the shutter control terminal is electrically coupled to the input node by a floating supply for providing an offset voltage from a voltage at the input node.

14. A buck converter as claimed in claim 13, further comprising a resistive component between the protection control terminal and the second protection main terminal.

15. A buck converter as claimed in claim 13, wherein at least one of the high-side switch, low-side switch, and shutter switch comprises a MOS transistor.

* * * * *